United States Patent
Shepard

(10) Patent No.: US 7,916,530 B2
(45) Date of Patent: Mar. 29, 2011

(54) SCR MATRIX STORAGE DEVICE

(75) Inventor: Daniel R. Shepard, North Hampton, NH (US)

(73) Assignee: Contour Semiconductor, Inc., N. Billerica, MA (US)

( * ) Notice: Subject to any disclaimer, the term of this patent is extended or adjusted under 35 U.S.C. 154(b) by 0 days.

(21) Appl. No.: 12/633,171

(22) Filed: Dec. 8, 2009

(65) Prior Publication Data

US 2010/0149865 A1 Jun. 17, 2010

Related U.S. Application Data

(63) Continuation of application No. 12/107,500, filed on Apr. 22, 2008, now Pat. No. 7,652,916, which is a continuation of application No. 10/913,218, filed on Aug. 6, 2004, now Pat. No. 7,376,008.

(60) Provisional application No. 60/493,108, filed on Aug. 7, 2003.

(51) Int. Cl.
*G11C 11/36* (2006.01)
*G11C 11/34* (2006.01)

(52) U.S. Cl. ................ 365/175; 365/105; 365/180

(58) Field of Classification Search ............. 365/175
See application file for complete search history.

(56) References Cited

U.S. PATENT DOCUMENTS

| | | |
|---|---|---|
| 3,697,962 A | 10/1972 | Beausoleil et al. |
| 3,986,177 A | 10/1976 | Picquendar et al. |
| 4,604,728 A | 8/1986 | Okajima |
| 4,608,672 A | 8/1986 | Roberts et al. |
| 4,646,266 A | 2/1987 | Ovshinsky et al. |
| 4,882,706 A | 11/1989 | Sinclair et al. |
| 5,412,598 A | 5/1995 | Shulman |
| 5,535,156 A | 7/1996 | Levy et al. |
| 5,640,343 A | 6/1997 | Gallagher et al. |
| 5,673,218 A | 9/1997 | Shepard |
| 5,889,694 A | 3/1999 | Shepard |
| 6,015,738 A | 1/2000 | Levy et al. |
| 6,034,882 A | 3/2000 | Johnson et al. |
| 6,064,100 A | 5/2000 | Wen et al. |
| 6,128,216 A | 10/2000 | Noble, Jr. et al. |
| 6,236,587 B1 | 5/2001 | Gudesen et al. |
| 6,459,095 B1 | 10/2002 | Heath et al. |
| 6,559,468 B1 | 5/2003 | Kuekes et al. |
| 6,574,130 B2 | 6/2003 | Segal et al. |
| 6,586,327 B2 | 7/2003 | Shepard |
| 6,643,159 B2 | 11/2003 | Fricke et al. |
| 6,689,644 B2 | 2/2004 | Johnson |
| 6,816,410 B2 | 11/2004 | Kleveland et al. |
| 6,885,581 B2 | 4/2005 | Nemati et al. |
| 6,956,767 B2 | 10/2005 | Kang et al. |
| 7,002,829 B2 | 2/2006 | Singh et al. |
| 7,170,770 B2 * | 1/2007 | Kang ..................... 365/175 |
| 7,573,077 B1 * | 8/2009 | Ershov ................... 365/105 |
| 7,687,830 B2 * | 3/2010 | Pellizzer et al. .......... 257/214 |
| 2005/0070052 A1 | 3/2005 | Singh et al. |

OTHER PUBLICATIONS

Nemati al., "A Novel Thyristor-based SRAM Cell (T-RAM) for High-Speed, Low-Voltage, Giga-scale Memories", *IEEE* (1999).
Nemati et al., "A Novel High Density, Low Voltage SRAM Cell with a Vertical NDR Device", *IEEE*, (1998).
Nemati et al., "Fully Planar 0.562 $\mu m^2$ T-RAM Cell in a 130nm SOI CMOS Logic Technology for High-Density High-Performance SRAMs", *IEEE* (2004).

* cited by examiner

*Primary Examiner* — Son L Mai
(74) *Attorney, Agent, or Firm* — Bingham McCutchen LLP

(57) ABSTRACT

In various embodiments, an addressable storage matrix includes a first plurality of intersection points, at least some of which are bridged by two-terminal non-linear elements that exhibit a threshold below which current flow is significantly lower than if the threshold is exceeded, as well as, disposed at each intersection point bridged by a non-linear element, a programmable material in series with the non-linear element and determining a bit state for the corresponding intersection point.

28 Claims, 5 Drawing Sheets

SCR MATRIX STORAGE DEVICE

CROSS-REFERENCE TO RELATED PATENTS AND PATENT APPLICATIONS

This application makes references to U.S. Pat. No. 5,673,218 for a "Dual-addressed Rectifier Storage Device" by Shepard, issued Sep. 30, 1997, patent application Ser. No. 09/821,182 for a "Dual-addressed Rectifier Storage Device" by Shepard, filed Mar. 29, 2001, Patent Application No. 60/459,169 for a "Enhanced Dual-addressed Rectifier Storage Device" by Shepard, filed Mar. 31, 2003, patent application Ser. No. 09/887,201 for a "Low Cost High Density Rectifier Matrix Memory" by Shepard, filed Jun. 22, 2001, and U.S. Pat. No. 6,586,327 for "Fabrication of Semiconductor Devices" by Shepard, issued Jul. 1, 2003, each of which is hereby incorporated by reference in its entirety. This application is a continuation of and claims priority to U.S. patent application Ser. No. 12/107,500, filed Apr. 22, 2008, which is a continuation of and claims priority to U.S. patent application Ser. No. 10/913,218, filed Aug. 6, 2004, now issued as U.S. Pat. No. 7,376,008, which claims the benefits of U.S. Provisional Application No. 60/493,108, filed on Aug. 7, 2003; each of these documents is hereby incorporated herein by reference in its entirety.

FIELD OF THE INVENTION

The present invention is an improvement on information storage arrays and in particular an improvement on reducing the impact of leakage currents within an information storage array based on diodes or other nonlinear conductors.

SUMMARY OF THE INVENTION

One of the simplest forms of data storage devices is the diode array storage device. However, a problem with diode array storage devices is that as the size of the array increases, the number of non-addressed diodes connected between a given selected row or column of the array and the non-addressed columns or rows of the array, respectively, also becomes very large. While the leakage current through any one non-addressed diode on the selected row or column will have little impact on the operation of the device, the cumulative leakage through multiple thousands of non-addressed diodes can become significant. This aggregate leakage current can become great enough that the output voltage can be shifted such that the threshold for distinguishing between a one state and a zero state of the addressed diode location can become obscured and can result in a misreading of the addressed diode location.

In a diode array storage device, a bit is addressed by selecting one row through the array and one column through the array whereby said selected row and column intersect at said bit. If the rows are the array dimension to which the storage diode anodes are connected and the columns are the other array dimension to which the storage diode cathodes are connected, selection of a row is accomplished by applying a high voltage and selection of a column is accomplished by selecting a low voltage such that the diode at the point of intersection of the selected row and the selected column is forward biased. The non-selected rows and columns would have a voltage present such that a diode at the intersection of a non-selected row and a non-selected column would see a zero, a reverse, or a very small forward bias; the source of the non-selected rows and columns typically is high impedance or floating so as not to induce or enable significant leakage currents. The binary state of the addressed bit is determined by the presence or absence of a current path—if a low impedance current path is present it represents one logic state and if it is not (either no current path or a high impedance current path) the other logic state is represented. The bit is read at an output by either measuring the current flowing into the selected row line, column line or both (or into the entire array or a portion of the array) or by measuring the voltage on the selected row line, column line, or both. In the case of the current measurement, a larger current reading would indicate the presence of a current path at the addressed location. In the case of the voltage measurement, a convergence of the voltages applied to the selected row and selected column would indicate the presence of a current path at the addressed location.

It must be noted that the selected row will typically have many diodes connected whose addressing is not intended and these diodes will often experience a slight forward bias and source a slight forward current to the non-selected columns. Likewise, the selected column will typically have many diodes connected whose addressing is not intended and these diodes will often experience a slight forward bias and sink a slight forward current from the non-selected rows. The extent of this current will be determined by the current paths existing within the array as a result of cumulative leakage currents of the many reverse biased diodes connecting the non-selected rows and non-selected columns. When the array is small, the cumulative leakage current is not a problem. But, when the array is very large, the cumulative leakage current can become great enough that the currents flowing in the non-addressed diodes on the selected row and selected column can become comparable to the current that would flow in an addressed diode if one is present. The cumulative reverse leakage currents of a vast number of diodes present in the array can be passed to the selected row and column because the forward biased diodes whose addressing is not intended are capable of passing much more that the limited leakage of a single reverse biased diode.

Furthermore, since the current leaked in this manner is a function of the data stored in the array and the amount of leakage when reading any given bit can be different, it can be difficult to predict or compensate for this leakage. This makes it difficult or impossible to determine the cause of the current path and, consequently, the binary state of the addressed bit.

The present invention is a means to manage the leakage currents in a diode array storage device. This is accomplished by actively changing the forward voltage of the diodes in the storage array such that a diode connected to the selected row line but that is not connected to the selected column line is in its high impedance state and a diode connected to the selected column line but that is not connected to the selected row line is in its high impedance state; only a diode that is connected to both the selected row line and the selected column line will switch to its low impedance state.

The present invention is an enhancement to all types of arrays of diodes or arrays of other nonlinear conducting elements including: storage devices, programmable logic devices, display arrays, sensor arrays, and many others.

DESCRIPTION OF THE PREFERRED EMBODIMENT

A diode storage array typically consists of two sets of wires, one set running vertically in one plain (the columns) and the other set running horizontally in another plane (the rows). At any given point where a row and column wire cross is an addressable data bit. This bit is defined to be one of two logic states if the wires simply pass each other without an electrical path connecting that row and column at that point of intersection, and the other logic state if an electrical path is present. To enable these data bits to be addressed individually (without current flowing from, say, an energized row, through a row/column connection to a column and then through another row/column connection to a second row, thereby energizing rows other than the desired row), the connection between row and column is made with a diode or with some other nonlinear conductor (this enables current to flow from a row to a column but not back to where it can energize another row). For the purposes of this discussion, we shall consider the lack of a conducting path a zero bit and the presence of a conducting path (a diode) to be a one bit.

In a diode array storage device, a bit is addressed by selecting one row through the array and one column through the array whereby said selected row and column intersect at said bit. If the rows are the array dimension to which the storage diode anodes are connected and the columns are the other array dimension to which the storage diode cathodes are connected, selection of a row is accomplished by applying a high voltage and selection of a column is accomplished by selecting a low voltage such that the diode at the point of intersection of the selected row and the selected column is forward biased. The non-selected rows and columns would have a voltage present such that a diode at the intersection of a non-selected row and a non-selected column would see a zero, a reverse, or a very small forward bias; the source of the non-selected rows and columns typically is high impedance or floating so as not to induce or enable significant leakage currents. The binary state of the addressed bit is determined by the presence or absence of a current path—if a low impedance current path is present it represents one logic state and if it is not (either no current path or a high impedance current path) the other logic state is represented. The bit is read at an output by either measuring the current flowing into the selected row line, column line or both (or into the entire array or a portion of the array) or by measuring the voltage on the selected row line, column line, or both. In the case of the current measurement, a larger current reading would indicate the presence of a current path at the addressed location. In the case of the voltage measurement, a convergence of the voltages applied to the selected row and selected column would indicate the presence of a current path at the addressed location.

Figure 1:
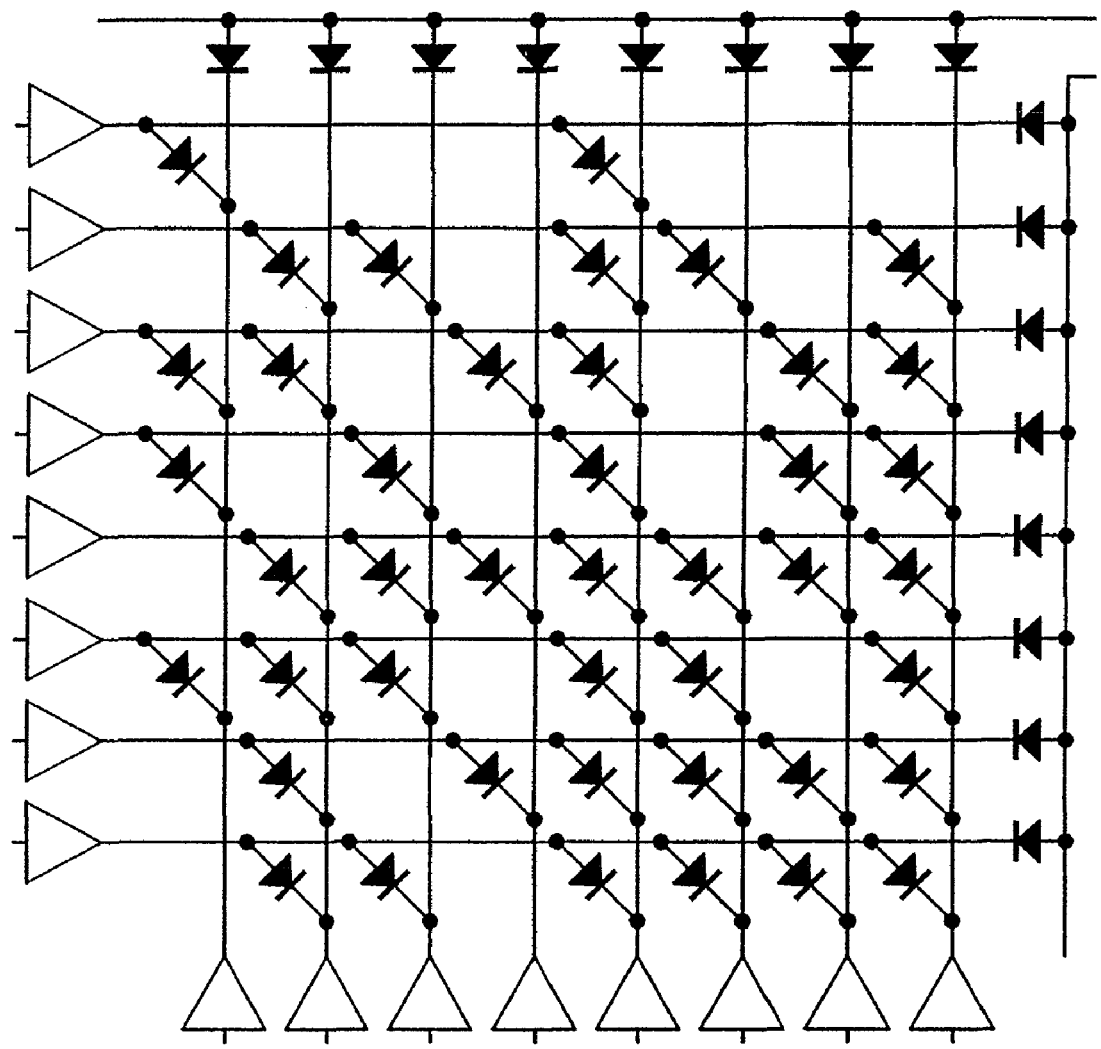
FIG. 1. illustrates a schematic diagram of a diode storage array.

FIG. 1 shows the structure of a diode memory array. To address a given bit, one row would be enabled (i.e., the voltage on that one row would be raised) and one column would be enabled (i.e., the voltage on that one column would be lowered). The addressed data bit is found at the point of intersection of that one enabled row and that one enabled column. If that row and column pass each other without any connection between the two (a zero bit), the voltage on that row will remain constant at the level to which it was raised in order to enable that row and the voltage on that column will remain constant at the level to which it was lowered in order to enable that column. If that row and column are connected with a diode having its cathode connected to the column and anode to the row (a one bit), the voltages on that row and that column will converge until they are separated by the forward voltage of the diode (note, this requires that the source of the voltages asserted on the row and column have sufficient impedance that excessive power is not dissipated, as is well understood by one skilled in the art).

In the circuit in FIG. 1, the state of the addressed bit is detected by connecting each row to a row detection output through an output diode such that the voltage on the row detection output will be lower than the voltage on the enabled row by one diode forward voltage drop. The bit state may alternatively or in addition to this be detected by connecting each column to a column detection output through an output diode such that the voltage on the column detection output will be higher than the voltage on the enabled column by one diode forward voltage drop. For a smaller diode array, the presence or absence of a diode at the addressed data bit location can be determined by measuring the voltages on the outputs. If the voltage on the row detection output is approximately one diode forward voltage drop below the voltage applied to the enabled row (or approximately one diode forward voltage drop above the voltage applied to the enabled column), then a zero bit has been addressed. If, on the other hand, the voltage is approximately half of one diode forward voltage diode drop below a voltage half way between the voltages applied to the enabled row and the enabled column, the addressed bit is a one bit. The state of the addressed bit can be determined at the detection outputs most simply with a comparator having its switching threshold set to a voltage level halfway between the "one" bit's voltage and the "zero" bit's voltage for that detection output.

The problems arise when the size of the array gets very, very large. In this case, the small currents leaking through each of the various diodes in the storage array can cumulatively be enough to cause the voltages at the row and column detection outputs to be shifted sufficiently to make those outputs indeterminate. The limit to the array size is a function of the difference between the on current and the off current of the diodes used to construct the array. Also, as the size of the array increases, non-uniformities across the array become more likely resulting in slightly different forward voltage drops across diodes in different areas of the array. Because of these problems, mass produced diode arrays and, in particular, diode memory arrays have been limited in their size to 1024 rows by 1024 columns or to an array of one gigabit.

For the purpose of this discussion of the present invention, we shall refer to a device that can switch the level of current it conducts as a "current level switching device" (CLSD). A well known device that can be used for this purpose is the four-layer device also known as the thrystor or as the Semiconductor Controlled Rectifier (SCR). For the purpose of this discussion, we shall refer to a device that switches from not (or low) conducting to conducting as the voltage across it is increased as a "current level on-switching device" (CLOSD) and this definition will comprise devices such as the SCR.

Figure 2:
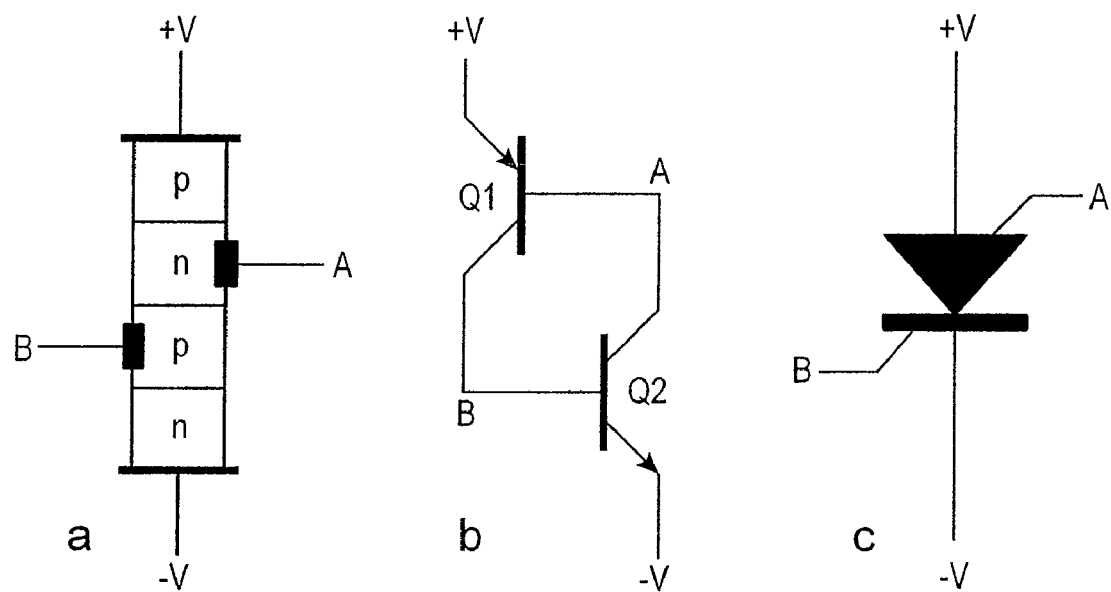
FIG. 2. illustrates a four-layer device, its equivalent transistor circuit, and the schematic symbol of the device.
Figure 3:
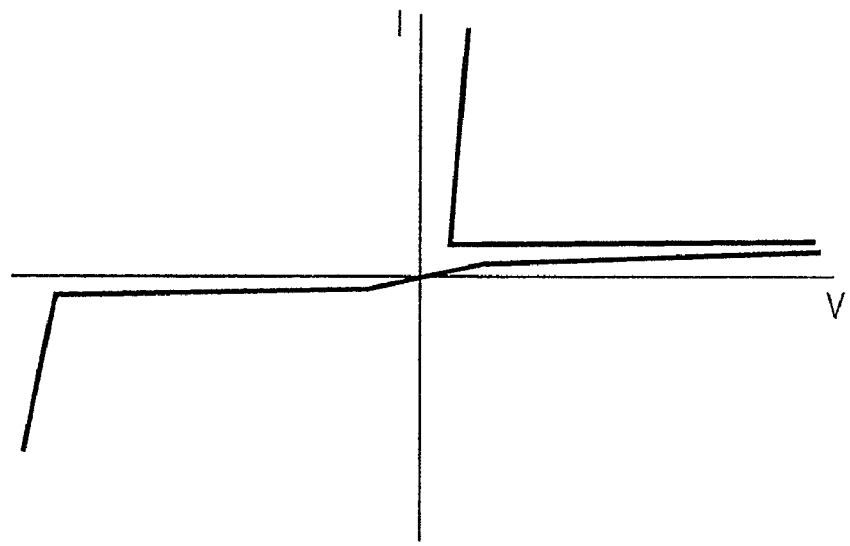
FIG. 3. illustrates the current verses voltage curve (IV curve) for a four-layer device.

FIG. 2a shows the structure of a four-layer device and FIG. 2b shows an equivalent SCR circuit. Looking at FIG. 2b, transistor Q1 is a PNP transistor that can be turned on by forward biasing the emitter-base junction from +V to point A. But, absent any outside connection to point A, the only current path for doing this is through Q2 when that transistor is turned on. Transistor Q2 is an NPN transistor that can be turned on by forward biasing the base-emitter junction from point B to −V. But, absent any outside connection to point B, the only current path into the base of Q2 is through Q1 when transistor Q1 is turned on. With low voltage applied across the SCR, both transistors are in their off state and minimal (leakage) current flows. As the voltage is increased, a threshold voltage is reached where Q1 and Q2 leak enough current that the leakage currents through Q1 and Q2 help to begin forward biasing the base-emitter junctions of Q2 and Q1 respectively thereby increasing the leakage currents through Q2 and Q1. This positive feedback of increased leakage currents further forward biases the base-emitter junctions which further increases the currents through Q2 and Q1 until both Q1 and Q2 are fully turned on. The IV curve of an SCR is shown in FIG. 3. As can be seen, as the forward voltage across the device is increased from zero, a small leakage current is exhibited until a threshold voltage, $V_{th}$, is reached at which point the device switches to high conductance mode. Once switched, even small forward voltages will result in larger currents. The voltage threshold where the device switches on is determined by its geometry (the thickness and geometry of the various layers) and doping concentrations and is well understood by those skilled in the art.

However, as is also known to those skilled in the art, this threshold can also be influenced by applying an external bias at points A or B (as shown in FIG. 2b). In particular, the threshold voltage can be increased by applying a small positive bias at point A (which makes it harder to forward bias the emitter-base junction of Q1) or by applying a small negative bias at point B (which makes it harder to forward bias the base-emitter junction of Q2). Likewise, the threshold voltage can be lowered by applying a small negative bias at point A (which makes it easier to forward bias the emitter-base junction of Q1) or by applying a small positive bias at point B (which makes it easier to forward bias the base-emitter junction of Q2).

Figure 4:
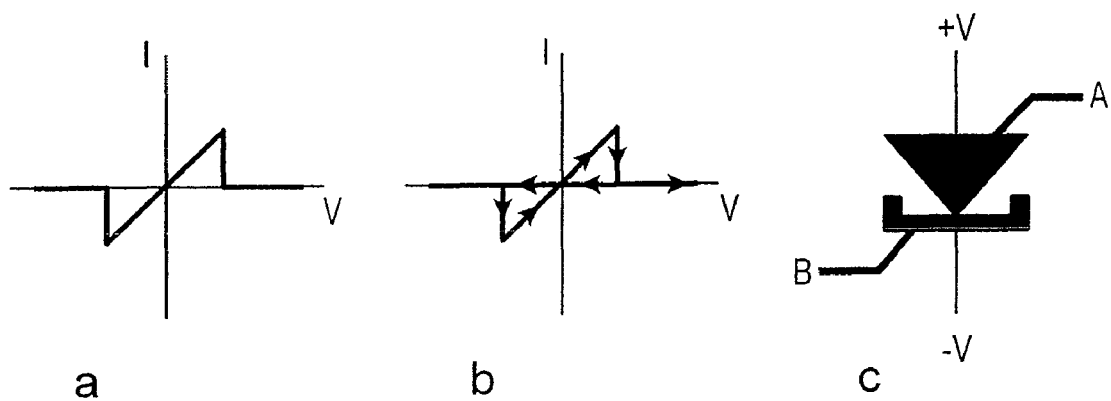
FIG. 4. illustrates current verses voltage curves (IV curves) for a ferroelectric schottky device, both non-memory and memory types, and a schematic symbol for the device.
Figure 5:
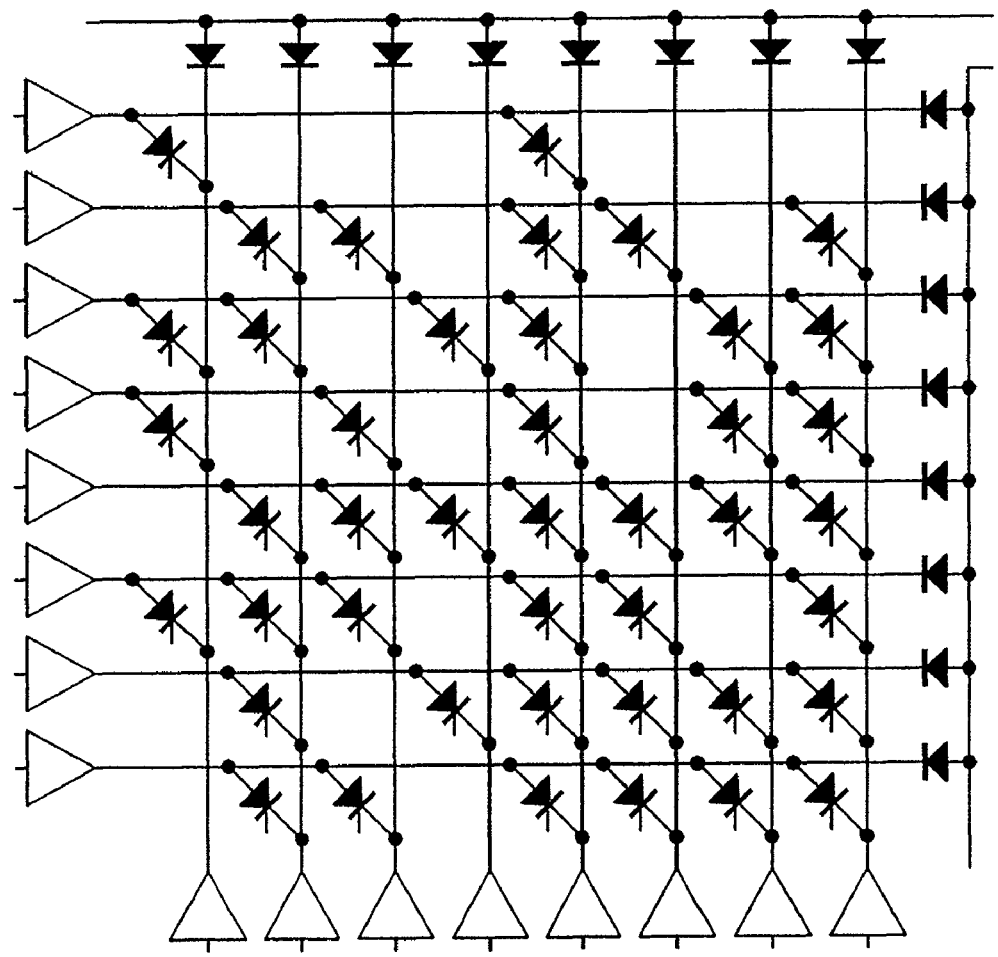
FIG. 5. illustrates a schematic diagram of a storage array according to the present invention.

Also, for the purpose of discussion of variations on the present invention, we shall refer to a device that switches from conducting to not (or low) conducting as the voltage across it is increased as a "current level off-switching device" (CLXSD) and this definition will comprise devices such as certain types of Ferroelectric devices such as the Ferroelectric Schottky Diode (FSD). A FSD is a two terminal device that conducts current like a medium value resistor as long as the applied voltage is not too large. However, as the voltage is increased, a threshold is reached whereby the current switches off. While some FSD devices have memory and must have a reverse voltage threshold exceeded before the device will conduct again, other non-memory FSD's will resume conducting by bringing the applied voltage back to zero or to near zero. FIG. 4a shows the IV curve for a non-memory FSD device and 4b shows the IV curve for a memory FSD. FIG. 4c shows a schematic symbol for the Ferroelectric schottky diode. We shall refer to a device that can switch off the current it conducts as the voltage across it is increased as a "CLXSD" and this definition will comprise devices such as the FSD.

In the present invention, the diodes in the storage array are replaced by CLOSD's such as SCR's. Such an enhancement still enjoys the benefits of a nonlinear element to enable current to flow from a row to a column but not back to where it can energize another row. Furthermore, because these devices will conduct little current until the voltage across the device exceeds the threshold voltage, a CLOSD can be used such that the threshold voltage is only reached at the point where the selected row and selected column intersect (currents through all other CLOSD's in the array will have to pass through additional CLOSD devices and the voltage drops across those other devices in the current path, along with other parasitic voltage drops and lower biasing voltages, will prevent the threshold voltage from being reached).

With CLOSD devices in the array such as SCR's, if the selected row has many SCR's connected whose addressing is not intended, these SCR's will only experience a slight reverse current leakage similar to a single diode device. Likewise, if the selected column has many SCR's connected whose addressing is not intended, these SCR's will only experience the slight reverse current leakage similar to a single device. The cumulative reverse leakage currents of a vast number of diodes present in the array cannot be supplied by the selected row and column because, unlike the diode based array wherein the forward biased diodes whose addressing is not intended are capable of passing much more than the limited leakage of a single reverse biased diode, in the SCR based array, all of these SCR's whose addressing is not intended are much more limited in the amount of current they can pass.

Figure 6:
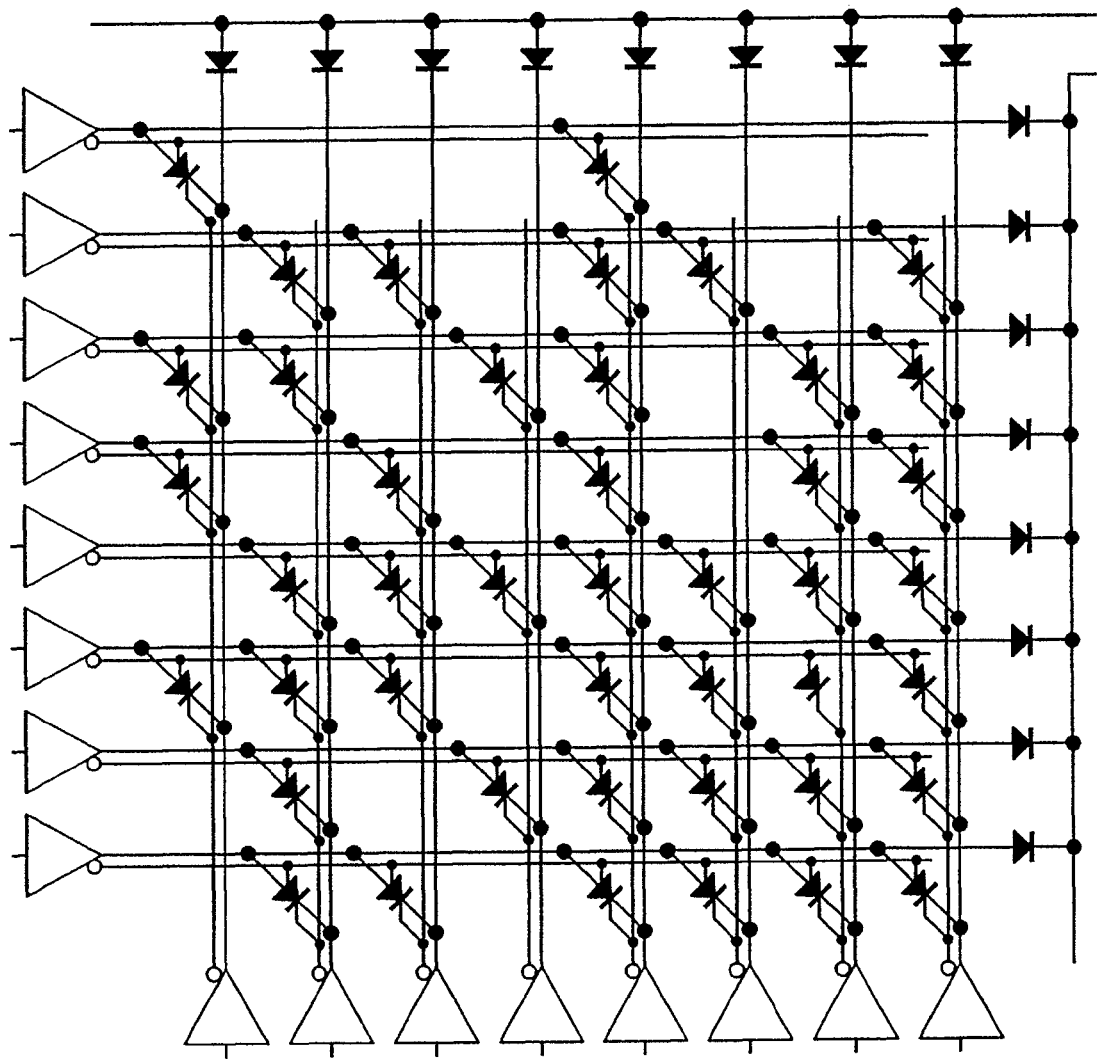
FIG. 6. illustrates a schematic diagram of a storage array according to the present invention further incorporating voltage threshold control means.

FIG. 6 shows a storage array according to the present invention further incorporating voltage threshold control means. In this variation the gate inputs to the SCR (points A and B in FIG. 2b) are separately controlled by the row and column selection logic. In this case, when the selected row is asserted high, a voltage potential is simultaneously applied to the gates A of the SCR's in that same row to lower their threshold voltage and control the switching of the devices on that row. At the same time, the gates A of the SCR's in the other rows would receive a different voltage potential thereby causing their threshold voltage to be raised. Also in this case, when the selected column is asserted low, a voltage potential is simultaneously applied to the gates B of the SCR's in that same column to lower their threshold voltage and control the switching of the devices on that column. The net effect of this threshold voltage controlling is to make the SCR at the point of intersection of the selected row and column more easily switched on with a lower forward voltage. It is believed that this will lower the overall power requirements of the device while improving the switching of the individual addressed bit device and lowering the likelihood of a falsely switched bit device at a non-addressed bit. Many variations of this gate control will come to mind to those skilled in the art and these variations may be influenced by the application. For example, only one of the two gate inputs might be used while either the anode or the cathode might be connected to a fixed voltage or, both gates could be used while either the anode or the cathode or both might be connected to fixed voltages. In the case of a display application, the current through the cathode and anode might be used to control the intensity of an SCR having a light emitting junction or of an LED in series with the SCR element while the two gates might be used for the row and column addressing to enable current flow through that addressed pixel bit. Many other permutations and combinations come to mind for applications in storage devices, programmable logic devices and logic arrays, display arrays, sensor arrays, and many other device types.

Figure 7:
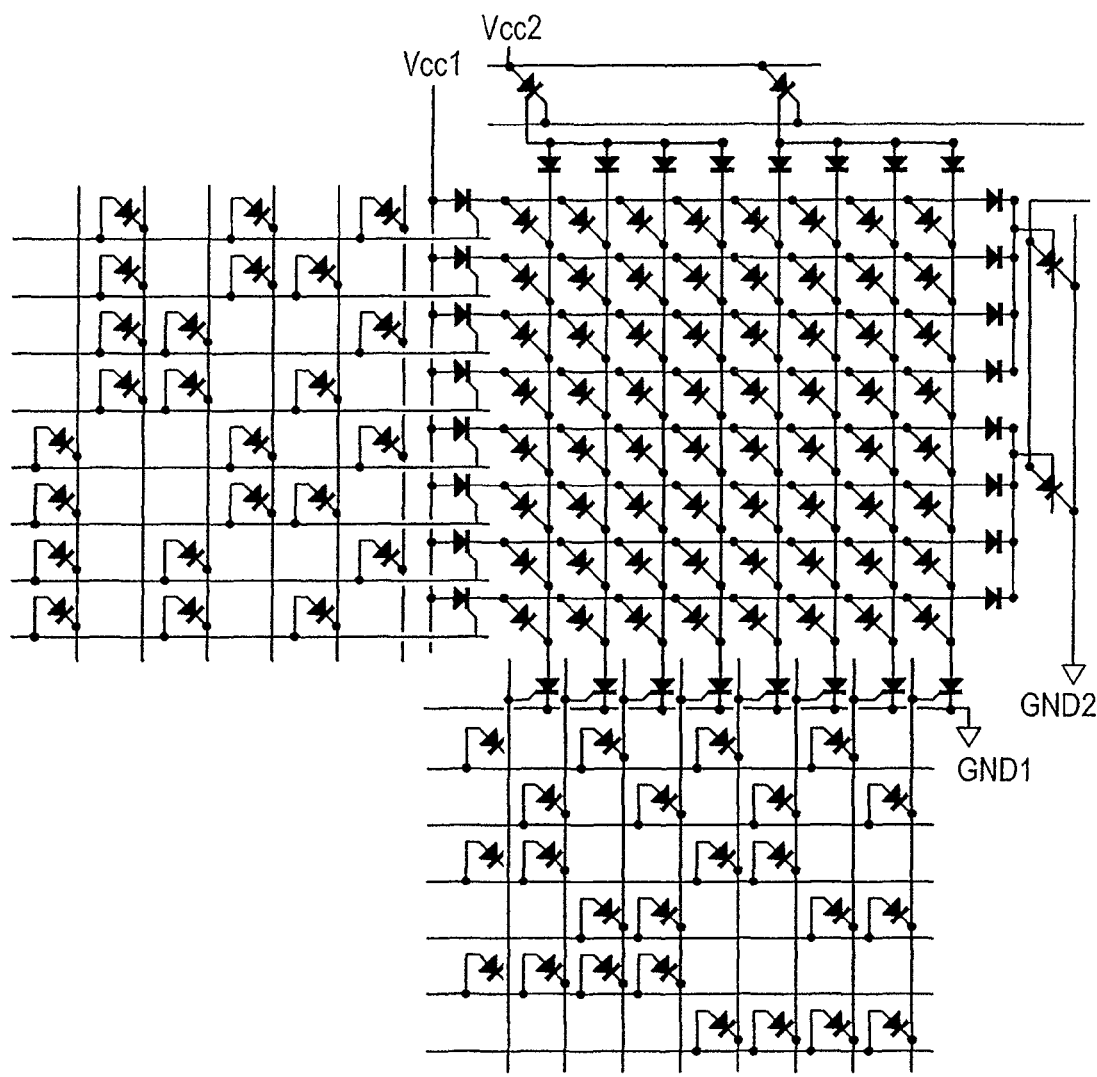
FIG. 7. illustrates a schematic diagram of a storage array according to the present invention further incorporating output fan out means.

FIG. 7 illustrates a storage array according to the present invention further incorporating both row and column address decoding according to Shepard in his Patent Application No.

60/459,169 for a "Enhanced Dual-addressed Rectifier Storage Device" as well as incorporating output fan out means. The output fan out uses CLSD devices for the output control by taking the voltage present on the rows or subgroups of the rows via output distribution diodes to control the switching threshold voltage of the output devices. In this way the binary state of the addressed bit will cause the output CLSD to be triggered or not and then to latch the output. This output means can be used to latch the output while the CLSD's of the address decoder and the storage elements to be relaxed (by removing power, Vcc1 and Gnd1, from just the address decoder CLSD's and storage element CLSD's while retaining power, Vcc2 and Gnd2, to the output CLSD's). This latched output variation may find applications in logic state machines whereby the outputs of a storage device constructed according to the present invention (in whole or in part) are fed back to some or all of the address inputs to form a simple state machine. It should be noted that any subdivision of the output rows and column could be accomplished, from one CLSD per row and/or column line (in which case no output distribution diodes would be necessary) to one CLSD for the entire row set and/or column set. Various permutations are possible.

Another variation would be to use a transistor as the CLSD device. These can include bipolar, FET, and other active devices. However, these are expected to be less desirable because of their continuous IV curve; devices such as the SCR have a discontinuity in their IV curve that enables then to be switched in an avalanching way.

Another variation would be to use CLXSD type devices in the array. This could be done by applying a large positive voltage to all the disabled rows and a large negative voltage to the disabled columns such that the voltage across any CLXSD device connected between an enabled row and a disabled column or a disabled row and an enabled column is enough to turn off that device, however the voltages must not be so great as to turn off any CLXSD device at the intersection of the enabled row and the enabled column.

A wide variety of materials can be used to fabricate the devices to construct a circuit according to the present invention. These materials include traditional semiconductor materials such as crystalline, polymorphic and amorphous semiconductors, group IV and III-V chemical semiconductors, metal-semiconductor interfaces, polymer, organic, carbon-nanotube, molecular, and many, many more and these semiconductor materials can be doped to varying degrees from intrinsic to slightly doped to heavily (including degeneratively) doped. All of these materials and others are widely known and well understood by those skilled in these various arts. Other materials not yet invented will become available for use according to the present invention.

For even greater bit densities, the present invention can be fabricated in 3-D in accordance with patent application Ser. No. 09/887,201 for a "Low Cost High Density Rectifier Matrix Memory" by Shepard, except for the storage elements being CLSD elements instead of diodes. Alternatively, the present invention can be used in a vector format (1 dimensional) instead of an array format (2 dimensional) to implement a CLSD based demultiplexer.

The present invention will find applications in factory programmed, Read Only Memory (ROM), One Time Programmable Read Only Memory (OTPROM), and Multiple Read/Write Memory (MRWM). OTPROM can be implemented through the inclusion of a fusible or antifusible material of which many material options are disclosed in the prior art and of which many materials are yet to be invented. MRWM can be implemented through the inclusion of a material that can change its conductivity characteristics between two or more states of which many material options are disclosed in the prior art and of which many materials are yet to be invented. These variations can be implemented by incorporating the programmable material in series with CLSD elements in the storage area. Write control is accomplished by addressing the bit to be programmed with a voltage level across that bit element that is greater than the voltage necessary to read that bit and to a level necessary to program that bit or, in the case of MRWM devices, to reprogram that bit. Memory cells that comprise materials such as the phase change materials (see Ovshinsky's U.S. Pat. No. 4,646,266), organic materials (see Gudesen's U.S. Pat. No. 6,236,587), magnetic RAM (MRAM) cells (see Gallagher's U.S. Pat. No. 5,640,343), molecular transistors or switches (see Kuekes' U.S. Pat. No. 6,559,468 and Heath's U.S. Pat. No. 6,459,095), or nanotube electromechanical switches (see Segal's U.S. Pat. No. 6,574,130 titled "Hybrid circuit having nanotube electromechanical memory" and issued on Jun. 3, 2003) are also suitable. The Ovshinsky, Gudesen, Gallagher, Kuekes, Heath and Segal patent documents are hereby incorporated by reference in their entirety. Memory cells comprising materials such as amorphous solids are also suitable. These materials and others are widely known and well understood by those skilled in these various arts. Other materials not yet invented will become available for use according to the present invention.

The present invention lends itself to such fabrication techniques as topology based lithography as disclosed by Shepard in U.S. Pat. No. 6,586,327 and this technique can efficiently and economically form a memory cell having a bottom terminal formed by a bottom wire and a top terminal formed more versatilely by a metal pad through planarization and etching techniques that can then be contacted by other circuit devices or conductors (as opposed to those fabrication techniques disclosed by Kuekes in his U.S. Pat. No. 6,559,468 and Heath in his U.S. Pat. No. 6,459,095 wherein a pair of crossed wires form a junction comprising an electrochemical cell whereby the bottom terminal is formed by the bottom wire and the top terminal is formed by the top wire).

Devices constructed according to the present invention will find applicability in such areas as storing digital text, digital books, digital music, digital audio, digital photography (wherein one or more digital still images can be stored including sequences of digital images), digital video, and digital cartography (wherein one or more digital maps can be stored), as well as any combinations thereof. These devices can be embedded or removable or removable and interchangeable among devices. They can be packaged in any variety of industry standard form factors including Compact Flash, Secure Digital, MultiMedia Cards, PCMCIA Cards, Memory Stick, any of a large variety of integrated circuit packages including Ball Grid Arrays, Dual In-Line Packages (DIP's), SOIC's, PLCC, TQFP's and the like, as well as in custom designed packages. These packages can contain just the memory chip, multiple memory chips, one or more memory chips along with other logic devices or other storage devices such as PLD's, PLA's, micro-controllers, microprocessors, controller chips or chip-sets or other custom or standard circuitry.

The foregoing description of an example of the preferred embodiment of the invention and the variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description, but rather by any claims appended hereto.

The invention claimed is:

1. An addressable storage matrix facilitating control over excessive current leakage, the matrix comprising:
   a first plurality of intersection points at least some of which are bridged by two-terminal non-linear elements that exhibit a threshold below which current flow is significantly lower than if the threshold is exceeded, each non-linear element exhibiting, at a given voltage and independent of the bit state for its corresponding intersection point, a first current level or a second current level greater than the first current level, the non-linear element exhibiting the second current level at the given voltage only if the non-linear element has been subjected to a voltage at least equal to the threshold; and
   disposed at each intersection point bridged by a two-terminal non-linear element, a programmable material in series with the two-terminal non-linear element and determining a bit state for the corresponding intersection point.

2. The addressable storage matrix of claim 1, wherein each non-linear element is selectable by subjection to a voltage at least equal to the threshold.

3. The addressable storage matrix of claim 1, further comprising address circuitry for determining the bit state at each intersection point.

4. The addressable storage matrix of claim 1, wherein at least some of said non-linear elements are semiconductor controlled rectifiers without gate control connections thereto.

5. The addressable storage matrix of claim 1, wherein at least some of said non-linear elements are ferroelectric Schottky diodes.

6. The addressable storage matrix of claim 1, wherein the storage matrix is a read-only memory.

7. The addressable storage matrix of claim 1, wherein the storage matrix is a one-time programmable read-only memory.

8. The addressable storage matrix of claim 1, wherein the storage matrix is a multiple read-write memory.

9. The addressable storage matrix of claim 1, further comprising a second plurality of intersection points, at least some of which are bridged by two-terminal non-linear elements and a second programmable material in series therewith, disposed above the first plurality of intersection points and connected to the first plurality of intersection points by at least one via.

10. The addressable storage matrix of claim 1, wherein the programmable material comprises a phase change material.

11. The addressable storage matrix of claim 1, wherein the programmable material comprises an organic material.

12. The addressable storage matrix of claim 1, wherein the programmable material comprises a magnetic RAM cell.

13. The addressable storage matrix of claim 1, wherein the programmable material comprises at least one of a molecular transistor or a molecular switch.

14. The addressable storage matrix of claim 1, wherein the programmable material comprises a nanotube electromechanical switch.

15. A method of forming a storage matrix, the method comprising:
   providing a first plurality of intersection points at least some of which are bridged by two-terminal non-linear elements that exhibit a threshold below which current flow is significantly lower than if the threshold is exceeded, each non-linear element exhibiting, at a given voltage and independent of the bit state for its corresponding intersection point, a first current level or a second current level greater than the first current level, the non-linear element exhibiting the second current level at the given voltage only if the non-linear element has been subjected to a voltage at least equal to the threshold; and
   providing, at each intersection point bridged by a two-terminal non-linear element, a programmable material in series with the two-terminal non-linear element and determining a bit state for the corresponding intersection point.

16. The method of claim 15, wherein each non-linear element is selectable by subjection to a voltage at least equal to the threshold.

17. The method of claim 15, further comprising providing address circuitry for determining the bit state at each intersection point.

18. The method of claim 15, wherein at least some of the non-linear elements are semiconductor controlled rectifiers without gate control connections thereto.

19. The method of claim 15, wherein at least some of the non-linear elements are ferroelectric Schottky diodes.

20. The method of claim 15, wherein the storage matrix is a read-only memory.

21. The method of claim 15, wherein the storage matrix is a one-time programmable read-only memory.

22. The method of claim 15, wherein the storage matrix is a multiple read-write memory.

23. The method of claim 15, further comprising:
   providing a second plurality of intersection points, at least some of which are bridged by two-terminal non-linear elements and a second programmable material in series therewith, disposed above the first plurality of intersection points; and
   connecting the second plurality of intersection points to the first plurality of intersection points with at least one via.

24. The method of claim 15, wherein the programmable material comprises a phase change material.

25. The method of claim 15, wherein the programmable material comprises an organic material.

26. The method of claim 15, wherein the programmable material comprises a magnetic RAM cell.

27. The method of claim 15, wherein the programmable material comprises at least one of a molecular transistor or a molecular switch.

28. The method of claim 15, wherein the programmable material comprises a nanotube electromechanical switch.

* * * * *